(12) United States Patent
Huang

(10) Patent No.: US 8,597,859 B2
(45) Date of Patent: Dec. 3, 2013

(54) METHOD AND STORAGE SYSTEM FOR REDUCING CONTAMINATION OF A PHOTOMASK

(75) Inventor: Tian-Xing Huang, Tainan (TW)

(73) Assignee: Sanyu Technology Co., Ltd., Tainan (TW)

( * ) Notice: Subject to any disclaimer, the term of this patent is extended or adjusted under 35 U.S.C. 154(b) by 112 days.

(21) Appl. No.: 13/110,474

(22) Filed: May 18, 2011

(65) Prior Publication Data

US 2011/0284423 A1 Nov. 24, 2011

(30) Foreign Application Priority Data

May 19, 2010 (TW) .............................. 99115945 A
Jul. 6, 2010 (TW) .............................. 99122160 A

(51) Int. Cl.
*G03F 1/66* (2012.01)
*G03F 1/62* (2012.01)

(52) U.S. Cl.
USPC ................................................ 430/5; 428/14

(58) Field of Classification Search
USPC ..................................... 430/5; 428/14; 355/53
See application file for complete search history.

(56) References Cited

U.S. PATENT DOCUMENTS

2006/0234134 A1* 10/2006 Tregub et al. ..................... 430/5

* cited by examiner

*Primary Examiner* — Stephen Rosasco
(74) *Attorney, Agent, or Firm* — Muncy, Geissler, Olds & Lowe, PLLC

(57) ABSTRACT

A method for reducing contamination of a photomask that has a pellicle frame holding a pellicle film to cover the photomask, and a sealed space defined by the pellicle frame, the pellicle film and the photomask, includes: (a) providing a pressure regulating hole in the pellicle frame; (b) disposing the photomask into a receiving space of a chamber to fluidly connect the sealed space with the receiving space of the chamber; and (c) varying a temperature of the photomask to change a gas pressure within the sealed space and to thereby produce a gas transfer between the sealed space and the receiving space through the pressure regulating hole.

3 Claims, 10 Drawing Sheets

METHOD AND STORAGE SYSTEM FOR REDUCING CONTAMINATION OF A PHOTOMASK

CROSS-REFERENCE TO RELATED APPLICATIONS

This application claims priority of Taiwanese application no. 099115945, filed on May 19, 2010, and Taiwanese application no. 099122160, filed on Jul. 6, 2010.

BACKGROUND OF THE INVENTION

1. Field of the Invention

This invention relates to a method and a storage system for reducing contamination of a photomask. More particularly, this invention relates to a method and a storage system for reducing contamination of a photomask by varying a temperature of the photomask.

2. Description of the Related Art

Lithography technology is one of main technologies for semiconductor integrated circuit fabrication processes, and is used to transfer a predetermined circuit pattern on a photomask onto a wafer by virtue of a lithography etching process. As a result, any defect or haze contamination on the photomask can be transferred to the wafer during a lithography process, resulting in an adverse affect one yield rate of subsequent processes. In particular, with the increasing development of integrated circuit technologies, the electronic products made thereby have more and more diverse functions, and the photomask used in the related technologies have smaller size restrictions and more complicated patterns. Therefore, any small defects or contaminants on the photomask will adversely affect the products. As such, the quality of the photomask is one of the key factors in semiconductor fabrication.

The contamination or haze formation on the photomask may be attributed to micro-dust particles falling onto the photomask, or to contaminating gases (for example, $H_2SO_4$, $H_2S$, $SO_2$, $NH_4$, etc.) that are deposited on the photomask after being subjected to excitation and reaction processes occurring during an exposure process. The contaminating gases may come from the materials that are used for making the photomask (such as, a substrate, a frame, an adhesive, etc.), residues of chemical substances (such as, sulfuric acid, hydrogen peroxide, ammonia, etc.) that are used in an etching process for forming a pattern on the photomask, a contaminating gas that exists in the environment, such as a storage system, or a clean room for the photomask, or a contaminating gas formed due to a scanning irradiation of the photomask.

In order to prevent micro-dust particles froth falling onto a circuit pattern of a photomask during transport or an exposure process, a pellicle is usually disposed on the photomask to cover the circuit pattern, by which the micro-dust particles can be kept outside of the depth of focus (DOF), and will not form any undesired image on a wafer. However, the contaminating gases are likely to accumulate between the photomask and the pellicle, after several times of exposure processes, and produce haze on the photomask.

SUMMARY OF THE INVENTION

Therefore, an object of the present invention is to provide an improved method and a storage system for reducing contamination of a photomask, both of which can overcome the aforesaid drawbacks associated with the prior art.

According to the first aspect of this invention, a method for reducing contamination of a photomask that has a pellicle frame holding a pellicle film to cover the photomask, and a sealed space defined by the pellicle frame, the pellicle film and the photomask, comprises:

(a) providing a pressure regulating hole in the pellicle frame;

(b) disposing the photomask into a receiving space of a chamber to fluidly connect the sealed space with the receiving space of the chamber; and (c) varying a temperature of the photomask to change a gas pressure within the sealed space and to thereby produce a gas transfer between the sealed space and the receiving space through the pressure regulating hole.

According to the second aspect of this invention, a storage system for a photomask that has a pellicle frame holding a pellicle film to cover the photomask, and a sealed space defined by the pellicle frame, the pellicle film and the photomask, comprises:

a chamber having a receiving space for receiving the photomask;

a fixing unit for fixing the photomask in the receiving space;

a ventilation unit to permit a gas transfer between inside and outside of the chamber; and a temperature control unit operable to vary a temperature of the photomask and to thereby change a gas pressure in the sealed space and produce a gas transfer through the pressure regulating hole.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
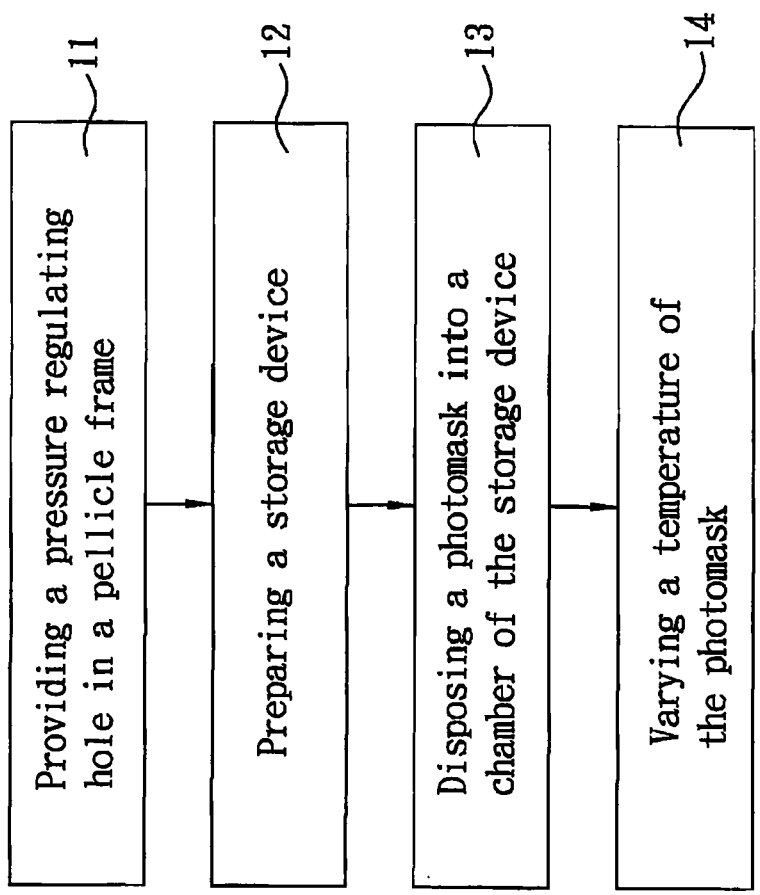
FIG. 1 is a flow chart showing a method for reducing contamination of a photomask according to this invention.

Before the present invention is described in greater detail with reference to the accompanying preferred embodiments, it should be noted herein that like elements are denoted by the same reference numerals throughout the disclosure.

This invention provides a method for reducing contamination of a photomask, which can be used to lower a concentration of contaminating substances, and to thereby reduce an incidence of contaminating the photomask. The photomask used in the present invention has a pellicle frame attached to a surface of the photomask and holding a pellicle film to cover a circuit pattern of the photomask and to prevent dust particles from falling onto the photomask and affecting an image to be formed on a wafer.

Figure 2:
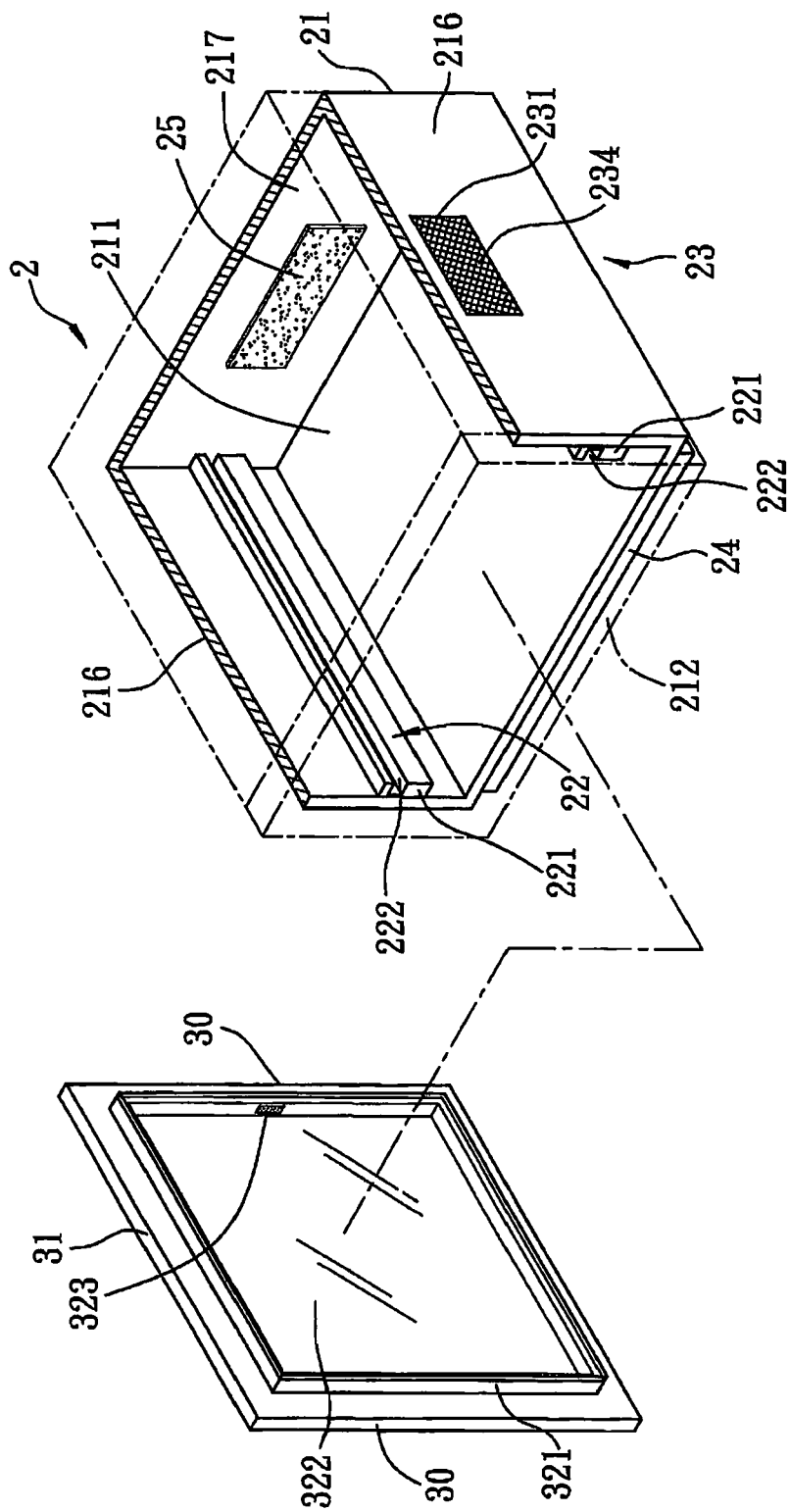
FIG. 2 is a perspective view illustrating the first preferred embodiment of a storage system for a photomask according to this invention.
Figure 3:
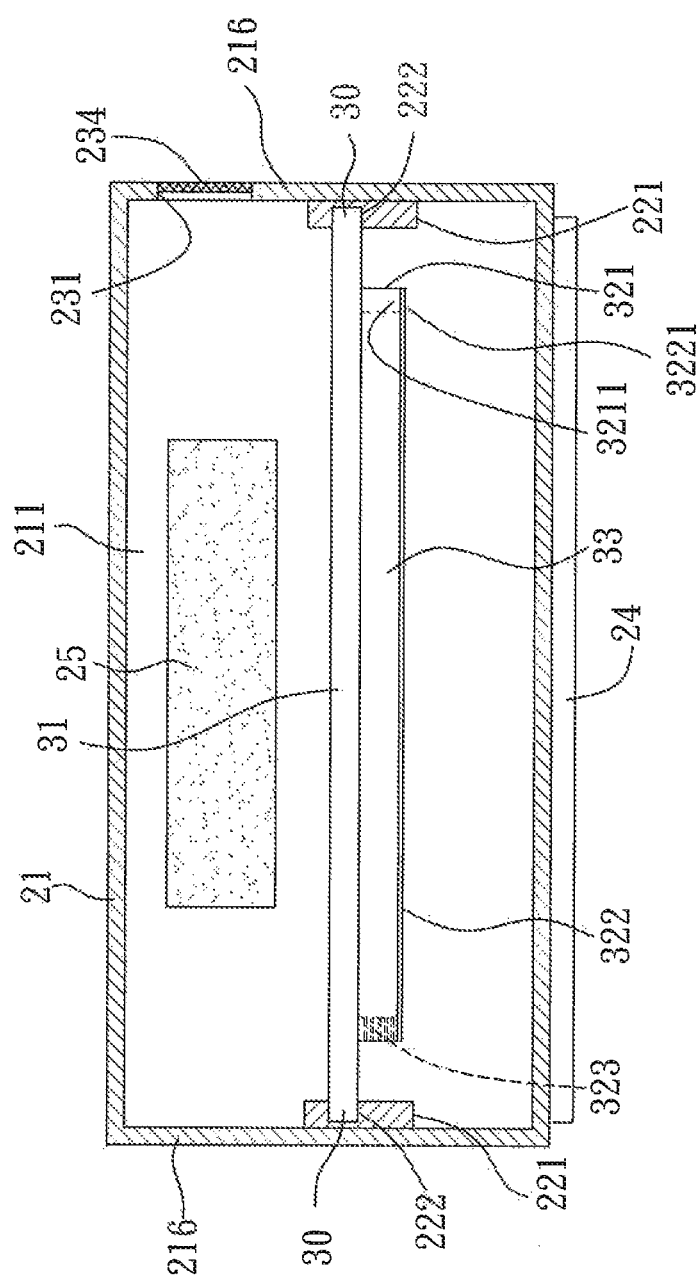
FIG. 3 is a cross-sectional view of the storage system in FIG. 2.

FIGS. 1 to 3 illustrate the first preferred embodiment of a method for reducing contamination of a photomask 31 according to this invention which comprises the following steps and utilizes a storage system 2 described below.

In step 11, a pressure regulating hole 323 is provided in the pellicle frame 321. Alternatively, a plurality of the pressure regulating holes may be provided in the pellicle frame 321.

In step 12, the storage system 2 for the photomask 31 is prepared.

The storage system 2 includes a chamber 21, a fixing unit 22, a ventilation unit 23, a temperature control unit 24, and an adsorption material 25.

The chamber 21 defines a receiving space 211 for receiving the photomask 31, and has a door plate 212 to close openably the receiving space 211. The chamber 21 as shown in FIG. 2 has two opposite chamber walls 216. The fixing unit 22 is used for fixing the photomask 31 in the chamber 21 and includes two slide rails 221 that project inwardly and respectively from the chamber walls 216 and that respectively have slide grooves 222 for retaining two opposite edges 30 of the photomask 31. The ventilation unit 23 is used for a gas transfer between inside and outside of the chamber 21, and has a vent hole 231 and a filter 234 disposed in the vent hole 231. The vent hole 231 is used to permit a gas flow into or out of the receiving space 221 of the chamber 21 to balance a pressure in the receiving space 221. The filter 234 is used for filtering the particulates suspended in an inflow gas from outside of the chamber 21.

The temperature control unit 24 is used for varying a temperature in the chamber 21 and the photomask 31. In this embodiment, the temperature control unit 24 is operated to heat or cool the chamber 21, and may be attached to a bottom side of the chamber 21, or disposed outside of the chamber 21. Any conventional temperature control unit that can vary the temperature of the chamber 21 may be used as the temperature control unit 24 in the present invention.

The adsorption material 25 is disposed in the receiving space 211 of the chamber 21. In this embodiment, the adsorption material 25 is detachably connected to a rear chamber wall 217 of the chamber 21, and is capable of adsorbing contaminating gases to reduce the concentration of the contaminating gases. The adsorption material 25 may be an activated carbon, a molecular sieve, etc.

In step 13, the photomask 31 is disposed into the receiving space 211 of the chamber 21 to fluidly connect the sealed space 33 with the receiving space 211 of the chamber 21 through the pressure regulating hole 323.

The photomask 31 has a predetermined circuit pattern, a pellicle frame 321 attached to the photomask 31 around the circuit pattern and holding a pellicle film 322 to cover the circuit pattern of the photomask 31, and a sealed space 33 defined by the photomask 31, the pellicle frame 321 and the pellicle film 322. The pellicle film 322 is a light-transmissive film glued to the pellicle frame 321 oppositely of the photomask 31. The pellicle film has a periphery 3221 that is connected to a mounting end 3211.

In step 14, the temperature of the photomask 31 is varied by varying the temperature of the chamber 21.

Specifically, in the step 14, the temperature of the chamber 21 is directly controlled by the temperature control unit 24 to vary the temperature inside the receiving space 211, i.e., to produce high or low temperatures inside the receiving space 211. As the temperature in the receiving space 211 is varied, the temperature of the photomask 31 is also varied so that the gases in the sealed space 33 expand or contract. Because the volumes of the sealed space 33 and the receiving space 211 are substantially constant and invariable, variation of the temperature in the sealed space 33 and the receiving space 211 will induce pressure changes, which generates an effect of stirring the gases in the sealed space 33 and the receiving space 211. Accordingly, a gas transfer or a gas exchange occurs between the sealed space 33 and the receiving space 211 through the pressure regulating hole 323, diluting the concentration of the contaminants in the sealed space 33. As a result, the chances of contaminating the photomask 31 can be reduced.

Besides, the adsorption material 25 may absorb the contaminants flowing into the receiving space 211 from the sealed space 33 to further reduce the concentration of the contaminants. Variation of the temperature in the receiving space 211 can also generate a gas transfer between the receiving space 211 and the ambient environment through the vent hole 231, which can dilute the contaminants in the receiving space 211.

Figure 4:
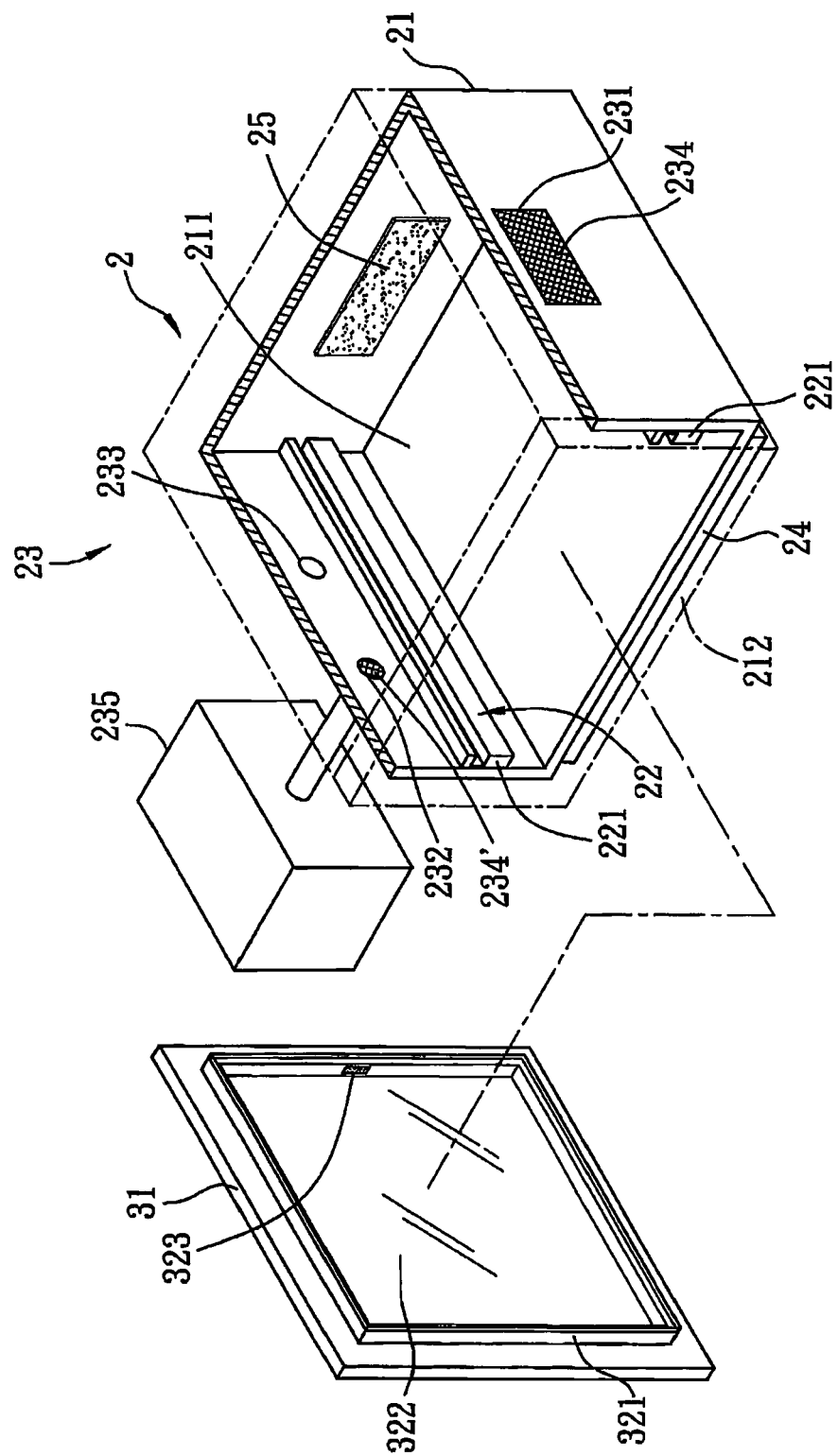
FIG. 4 is a perspective view illustrating a modified configuration of the first preferred embodiment of the storage system according to this invention.

Referring to FIG. 4, in order to further reduce the contaminants, the ventilation unit 23 may further include a gas-inputting device 235, and inlet and outlet holes 232, 233 to permit a gas to flow into or out of the chamber 21. A filter 234' may be disposed in the inlet hole 232. The gas-inputting device 235 is connected to the inlet hole 232 for inputting a gas into the chamber 21. The gas inputted by the gas-inputting device 235 may be air, nitrogen, oxygen, or an inert gas.

During the heating/cooling of the chamber 21 using the temperature control unit 24, the gas is inputted into the receiving space 211 through the inlet hole 232 by the gas-inputting device 235, and the gases in the receiving space 211 are permitted to flow out through the outlet hole 233 and the vent hole 231. With the use of the gas-inputting device 235, the concentration of the contaminants can be reduced further. By virtue of the vent hole 231, a pressure balance may be maintained in the receiving space 211, and instantaneous excessive pressure variation that can occur when the gases flow into and out of the receiving space 211 at different flow rates can be avoided. The excessive pressure variation may result in deformation of the pellicle film 322, which may adversely affect the optical properties of the photomask 31 in a subsequent exposure process.

Figure 5:
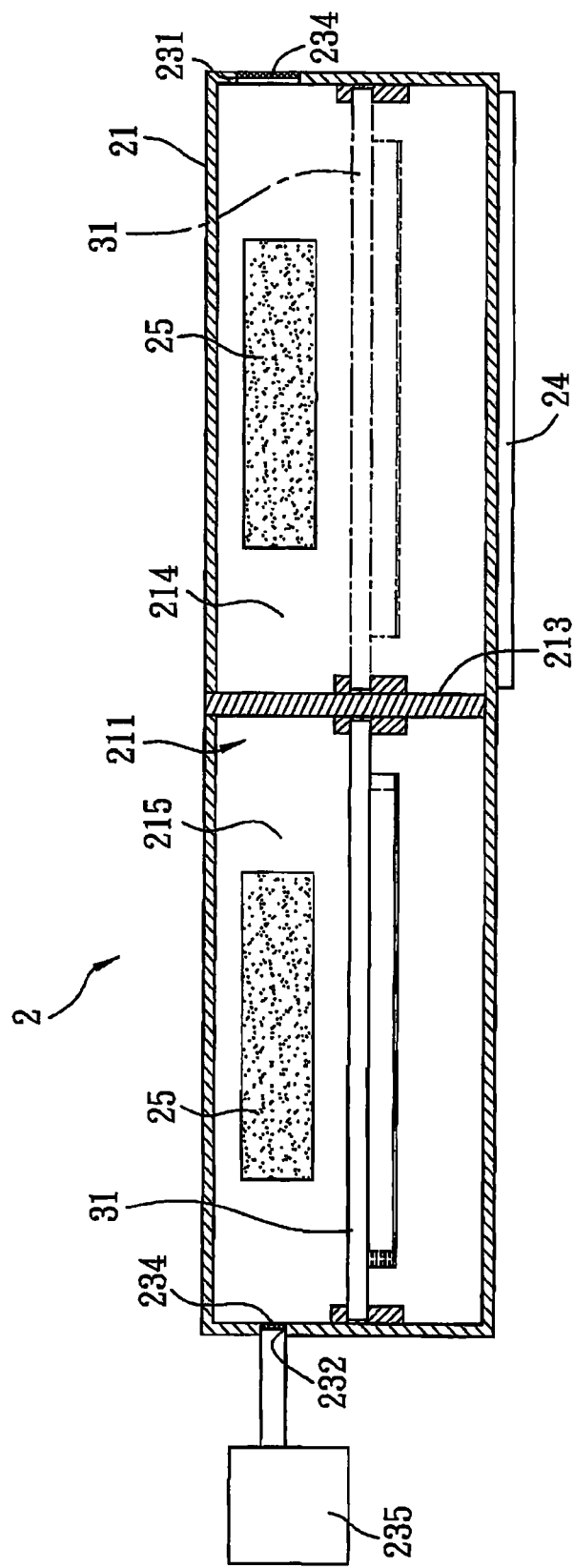
FIG. 5 is a cross-sectional view illustrating another modified configuration of the first preferred embodiment of the storage system according to this invention.

As shown in FIG. 5, the chamber 21 of the storage system 2 may have a partition member 213 to separate the receiving space 211 of the chamber 21 into first and second spaces 214, 215. Each of the first and second spaces 214, 215 is adapted for receiving the photomask 31. The temperature control unit 24 may be operated to control the temperature in the first space 214 to be higher than that in the second space 215, and the gas-inputting device 235 may input gas into the second space 215. In the step 13, the temperature of the photomask 31 may be varied by moving the photomask 31 from the first space 214 to the second space 215, and vice versa.

Figure 6:
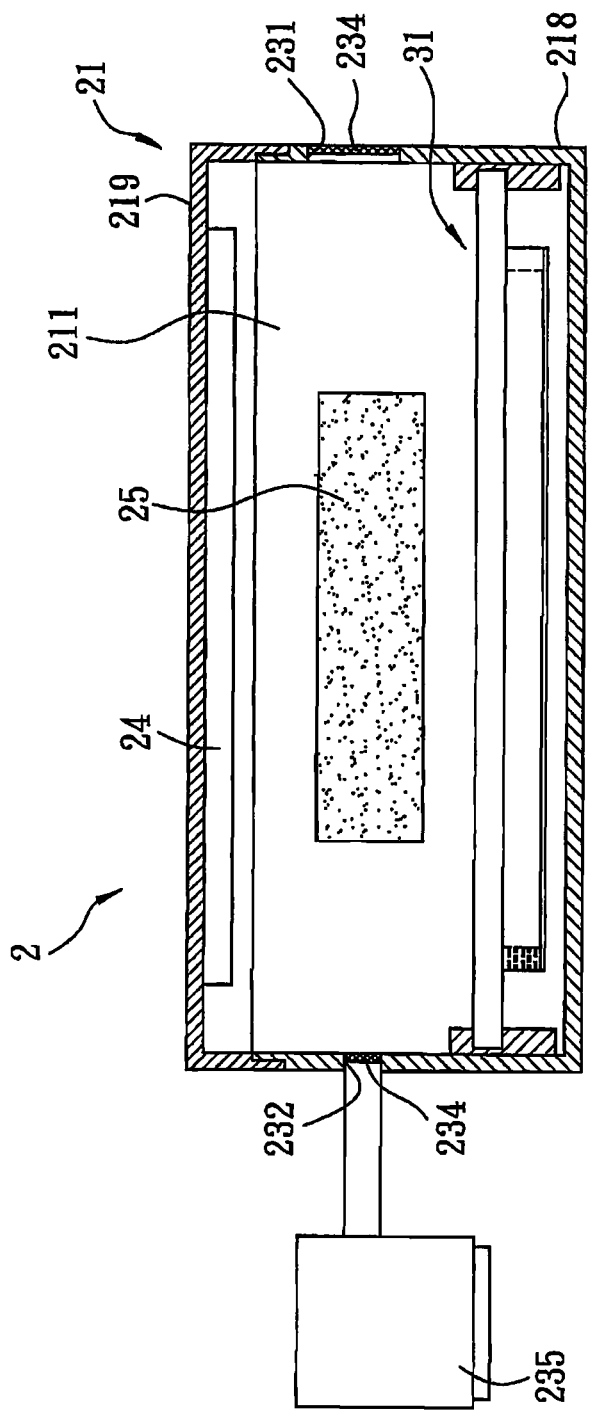
FIG. 6 is a cross-sectional view illustrating yet another modified configuration of the first preferred embodiment of the storage system according to this invention.

Referring to FIG. 6, the chamber 21 of the storage system 2 may be composed of the door plate 212 (see FIG. 2), a base portion 218, and a cover portion 219. The photomask 31 is received in the base portion 218. The temperature control unit 24 is attached to the cover portion 219 and is disposed in the receiving space 211. The temperature control unit 24 disposed inside the chamber 21 can directly control the temperature of the photomask 31.

Figure 7:
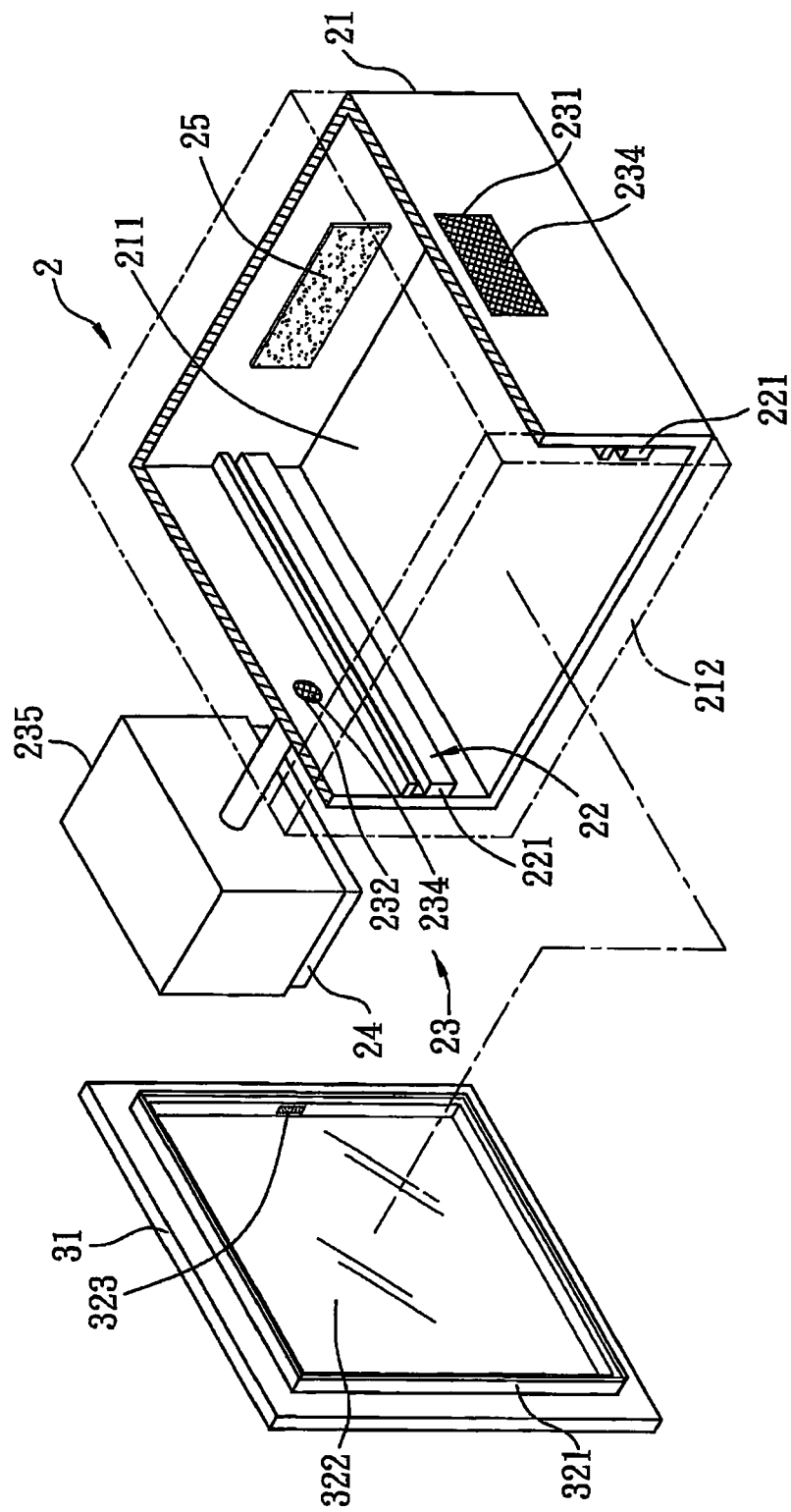
FIG. 7 is a perspective view illustrating the second preferred embodiment of a storage system for a photomask according to this invention.
Figure 8:
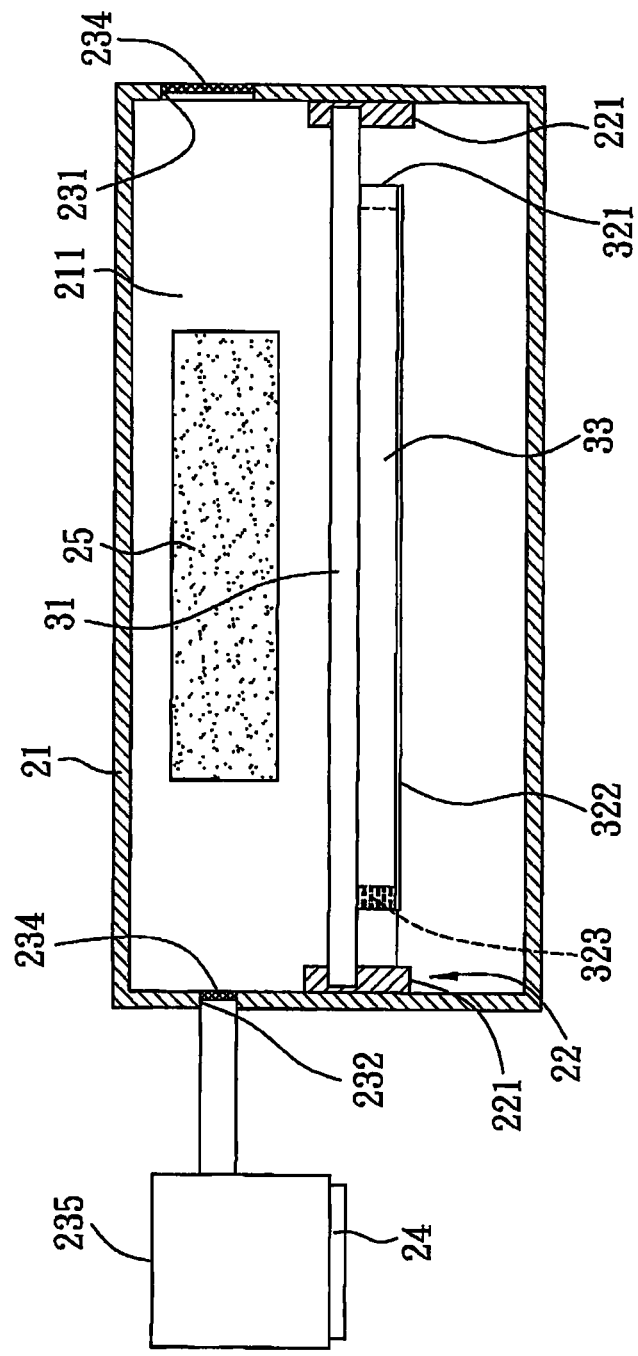
FIG. 8 is a cross-sectional view of the storage system in FIG. 7.

Referring to FIGS. 1, 7 and 8, the second preferred embodiment of a method for reducing contamination of a photomask 31 according to this invention comprises the following steps and utilizes a storage system described below.

In step 11, the pellicle frame 321 has the pressure regulating hole 323.

In step 12, the storage system 2 used in the second preferred embodiment differs from that shown in FIG. 4 in that the chamber 21 does not include the outlet hole 233, and that the temperature control unit 24 is connected to the gas-inputting device 235 for controlling a temperature of the gas inputted into the chamber 21.

In step 13, the photomask 31 is disposed in the receiving space 211 of the chamber 21 to fluidly connect the sealed space 33 with the receiving space 211 of the chamber 21 through the pressure regulating hole 323.

In step 14, the temperature of the photomask 31 is varied by controlling the temperature of the gas inputted into the chamber 21.

Specifically, in the step 14, the temperature of the gas inputted into the chamber 21 is controlled by the temperature control unit 24. The gas-inputting device 235 inputs a first gas, which has a temperature higher than a temperature of the receiving space 211 through the inlet hole 232 for a period of time. Thus, the temperature in the receiving space 211 is raised. Thereafter, a second gas, which has a temperature lower than that of the first gas, is inputted into the receiving space 211. During the inputting of the first and second gases, the gases inside the receiving space 211 flow out of the chamber 21 through the vent hole 231. By inputting the first and second gases with the different temperatures, the temperatures in the receiving space 211 and in the sealed space 33 of the photomask 31 are varied, resulting in a change of gas pressure and hence an effect of stirring the gases in the sealed space 33. Thus, a gas transfer between the sealed space 33 and the receiving space 211 of the chamber 21 is induced to dilute e the concentration of the contaminating gases in the sealed space 33. Preferably, the temperature of the photomask 31 is varied periodically by inputting the first and second gases alternatively. Besides, the introduction of the first and second gases into the receiving space 211 facilitates an outflow of the contaminating gases, and helps adsorption of the contaminating gases by the adsorption material 25.

Figure 9:
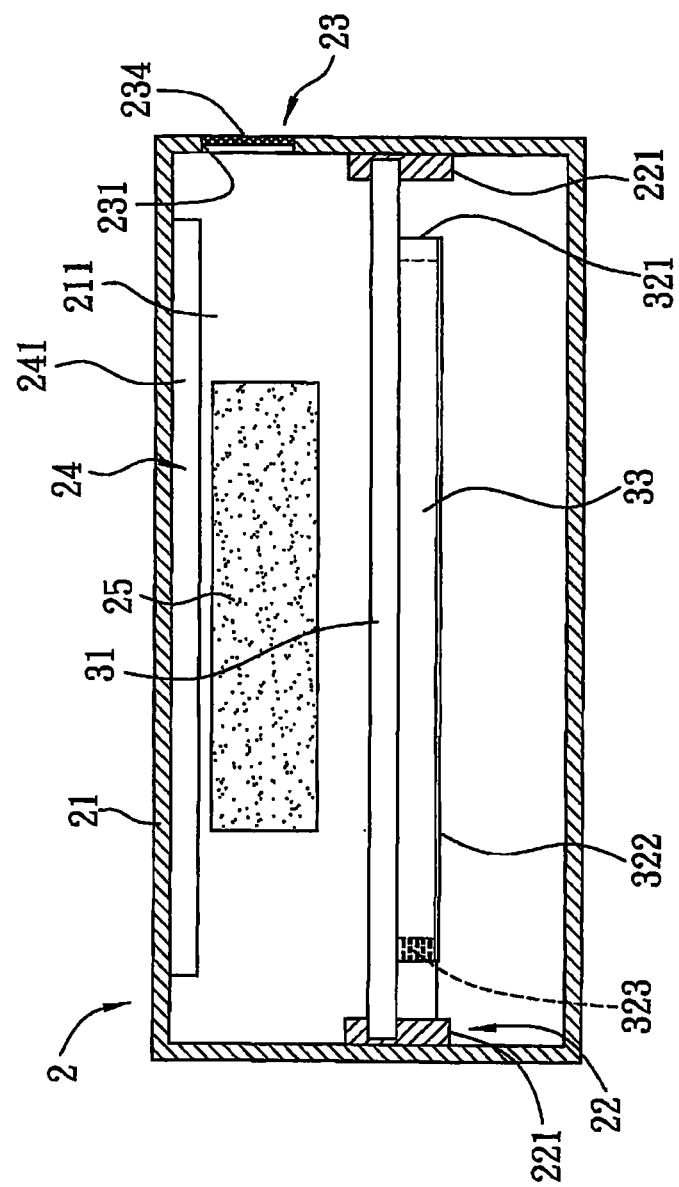
FIG. 9 is a cross-sectional view illustrating the third preferred embodiment of a storage system for a photomask according to this invention.

Referring to FIGS. 1 and 9, the third preferred embodiment of a method for reducing contamination of a photomask 31 according to this invention comprises the following steps and utilizes a storage system described below.

In step 11, the pellicle frame 321 has the pressure regulating hole 323.

In step 12, the storage system 2 of the third preferred embodiment differs from that of the first preferred embodiment in that the temperature control unit 24 in this embodiment has a lighting element 241 connected to the chamber 21 and disposed in the receiving space 211.

The lighting element 241 can emit light with a predetermined wavelength and is used for irradiating the photomask 31. After the photomask 31 absorbs the energy from the lighting element 241, the temperature thereof is increased, and the pressure inside the sealed space 33 is varied. However, if the energy from the lighting element 241 is overly high, the molecules of the contaminating gases can be excited or activated to form haze on the photomask 31. Therefore, the wavelength of the light emitted by the lighting element 241 is preferably not less than 193 nm. Preferably, the light emitted by the lighting element 241 has a wavelength larger than 246 nm and may be an infrared ray.

Besides, the photomask 31 may be fully or partially irradiated by the lighting element 241 using a scanning irradiation. The lighting element 241 may be disposed to face the photomask 31 or the pellicle film 322. In the preferred embodiment, the lighting element 241 is disposed to face the photomask 31, and the photomask 31 is partially irradiated by the lighting element 241 through a scanning irradiation.

In step 13, the photomask 31 is disposed in the receiving space 211 to fluidly connect the sealed space 33 with the receiving space 211 of the chamber 21 through the pressure regulating hole 323.

In step 14, the temperature of the photomask 31 is varied by irradiating the photomask 31.

Specifically, in the step 14, the photomask 31 is scan-irradiated by the light from the lighting element 241. An irradiated portion of the photomask 31 will absorb the energy of the light to have an increased temperature. Accordingly, a localized temperature variation occurs in the sealed space 33, resulting in a relatively large stirring effect and gas transfer between the sealed space 33 and the receiving space 211.

As an alternative, the temperature control unit 24 may be disposed at an outside of the chamber 21, the chamber 21 may have a light-transmissive wall (not shown); and the lighting element 241 of the temperature control unit 24 may be used to irradiate the photomask 31 through the light-transmissive wall. With the lighting element 241 disposed outside of the chamber 21, the gas molecules in the sealed space 33 may also be stirred to produce a gas transfer between the sealed space 33 and the receiving space 211.

Figure 10:
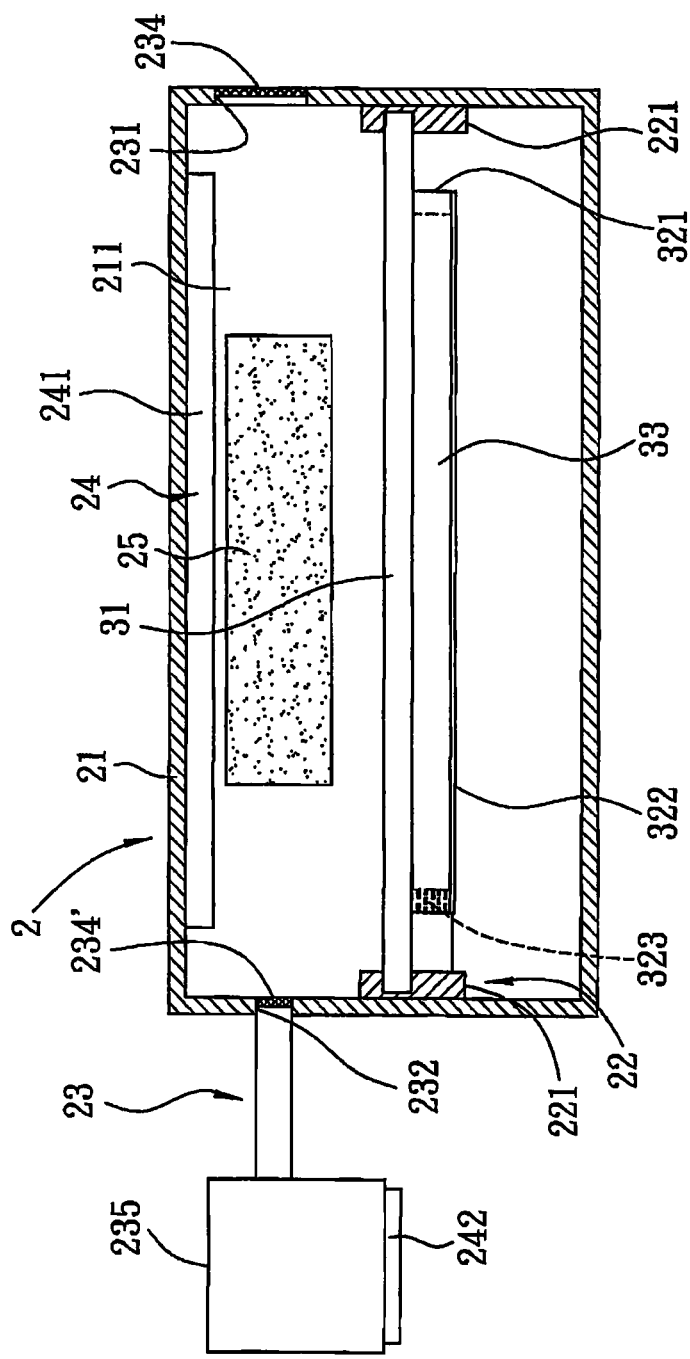
FIG. 10 is a cross-sectional view illustrating a modified configuration of the third preferred embodiment of the storage system according to this invention.

Referring to FIG. 10, as another alternative, the ventilation unit 23 in the third preferred embodiment may further include the inlet hole 232, the filters 234, 234' and the gas-inputting device 235. The temperature control unit 24 may further include a temperature control member 242 connected to the gas-inputting device 235.

When the lighting element 241 irradiates the photomask 31, the gas-inputting device 235 can also input the gas for heating or cooling the photomask 31. Preferably, the inlet hole 232 is disposed at a location that can direct the gas from the gas-inputting device 235 toward the photomask 31 to produce a significantly large temperature variation and a relatively large stirring effect.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for cleaning a photomask unit that includes: a photomask having an inner major surface which has a circuit pattern; a pellicle frame extending from the photomask to surround the circuit pattern and to terminate at a mounting end; a pellicle film having a periphery that is connected to the mounting end, to thereby define a sealed space; and at least one ventilation port disposed in the pellicle frame to fluidly communicate with the sealed space, the method comprising:

mounting the photomask unit in a receiving space of a chamber, the chamber having inlet and outlet holes to permit a cleaning gas to flow into and out of the chamber, respectively; and generating a temperature differential between the receiving space and the sealed space so as to permit the cleaning gas to flow out of or into the ventilation port;

wherein the temperature differential is generated intermittently by irradiating the photomask unit with infrared ray.

2. The method of claim 1, wherein the temperature differential is further controlled by introducing the cleaning gas with a predetermined temperature into the chamber.

3. The method of claim 1, wherein the cleaning gas is selected from the group consisting of air, nitrogen, oxygen, and inert gas.

* * * * *